United States Patent
Wu et al.

(10) Patent No.: US 7,955,871 B2
(45) Date of Patent: *Jun. 7, 2011

(54) METHOD OF USING A SWITCHABLE RESISTIVE PEROVSKITE MICROELECTRONIC DEVICE WITH MULTI-LAYER THIN FILM STRUCTURE

(75) Inventors: Naijuan Wu, Houston, TX (US); Xin Chen, Houston, TX (US); Alex Ignatiev, Houston, TX (US)

(73) Assignee: Board of Regents, University of Houston, Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/586,143

(22) Filed: Sep. 17, 2009

(65) Prior Publication Data

US 2010/0134239 A1 Jun. 3, 2010

Related U.S. Application Data

(63) Continuation of application No. 11/034,695, filed on Jan. 13, 2005, now Pat. No. 7,608,467.

(60) Provisional application No. 60/536,155, filed on Jan. 13, 2004.

(51) Int. Cl.
*H01L 21/00* (2006.01)
*H01L 29/76* (2006.01)

(52) U.S. Cl. .......................................... 438/3; 257/295

(58) Field of Classification Search .............. 438/3, 261, 438/287, 785; 257/295, 617
See application file for complete search history.

(56) References Cited

U.S. PATENT DOCUMENTS

| | | | |
|---|---|---|---|
| 5,274,249 A | 12/1993 | Xi et al. | |
| 5,527,567 A | 6/1996 | Desu et al. | |
| 6,204,139 B1 * | 3/2001 | Liu et al. | 438/385 |
| 6,653,703 B2 | 11/2003 | Hosotani et al. | |
| 7,029,924 B2 | 4/2006 | Hsu et al. | |
| 7,326,979 B2 * | 2/2008 | Rinerson et al. | 257/295 |
| 7,608,467 B2 * | 10/2009 | Wu et al. | 438/3 |
| 2004/0159828 A1 | 8/2004 | Rinerson et al. | |

OTHER PUBLICATIONS

"Growth, Transport, and Magnetic Properties of Pr0.67 Ca0.33MnO3 Thin Films," S.K. Singh, et al., Appl. Phys. Lett., vol. 69, pp. 263-265, 1996.

"Electric-pulse-induced Reversible Reisistance Change Effect in Magnetoresistive Films," S.Q. Liu, et al., Appl. Phys. Lett., vol. 76, pp. 2749-2751, 2000.

Non-final Rejection dated Dec. 31, 2008 for U.S. Appl. No. 11/034,695.

(Continued)

*Primary Examiner* — Calvin Lee
(74) *Attorney, Agent, or Firm* — Jennifer S. Sickler; Gardere Wynne Sewell LLP (57) ABSTRACT

A switchable resistive device has a multi-layer thin film structure interposed between an upper conductive electrode and a lower conductive electrode. The multi-layer thin film structure comprises a perovskite layer with one buffer layer on one side of the perovskite layer, or a perovskite layer with buffer layers on both sides of the perovskite layer. Reversible resistance changes are induced in the device under applied electrical pulses. The resistance changes of the device are retained after applied electric pulses. The functions of the buffer layer(s) added to the device include magnification of the resistance switching region, reduction of the pulse voltage needed to switch the device, protection of the device from being damaged by a large pulse shock, improvement of the temperature and radiation properties, and increased stability of the device allowing for multivalued memory applications.

8 Claims, 8 Drawing Sheets

OTHER PUBLICATIONS

Non-final Rejection dated Nov. 20, 2007 for U.S. Appl. No. 11/034,695.

Non-final Rejection dated Feb. 22, 2007 for U.S. Appl. No. 11/034,695.

* cited by examiner

METHOD OF USING A SWITCHABLE RESISTIVE PEROVSKITE MICROELECTRONIC DEVICE WITH MULTI-LAYER THIN FILM STRUCTURE

CROSS-REFERENCE TO RELATED APPLICATIONS

This application is a continuation of U.S. application Ser. No. 11/034,695, filed on Jan. 13, 2005 now U.S. Pat. No. 7,608,467, which claims the benefit of the following U.S. Provisional Application No. 60/536,155, filed Jan. 13, 2004.

STATEMENT REGARDING FEDERALLY SPONSORED RESEARCH OR DEVELOPMENT

Not Applicable.
REFERENCE TO A "SEQUENTIAL LISTING," A TABLE, OR A COMPUTER PROGRAM LISTING APPENDIX SUBMITTED ON A COMPACT DISC
Not Applicable.

BACKGROUND OF THE INVENTION

1. Field of the Invention

The present invention relates to a two-terminal microelectronic device, and, in particular, to a two-terminal non-volatile resistor device, having a structure of electrode/perovskite-active-material-layer/electrode, which is an Electric-Pulse-Induced-Resistance change device, commonly referred to by the acronym EPIR.

2. Description of the Related Art

The properties of materials having a perovskite structure, among them colossal magneto-resistance (CMR) materials and high transition temperature superconductivity (HTSC) materials, can be changed significantly by external influences, such as temperature, magnetic field, electric field, photons, and pressure.

Traditional CMR resistance change effect under high magnetic fields, is set out, for example, in the paper "Growth, Transport, and Magnetic Properties of $Pr_{0.67}Ca_{0.33}MnO_3$ Thin Films", S. K. Singh, et al, Appl. Phys. Lett., vol. 69, pp. 263-265, 1996. The pulsed electric field or pulsed current through the sample cannot create a high enough magnetic induction to change the resistance of the PCMO.

The electric resistance of the perovskite materials, particularly CMR and HTSC materials, can be modified by applying one or more short electrical pulses to a thin film or bulk material. The electric field strength or electric current density of the pulse is sufficient to switch the physical state of the materials so as to modify the properties of the material. The pulse is desired to have low energy so as not to destroy the material. (S. Q. Liu, N. J. Wu, and A. Ignatiev, Applied Physics Letters, 76, 2749 (2000).) Multiple pulses may be applied to the material to produce incremental changes in properties of the material (S. Q. Liu, N. J. Wu, and A. Ignatiev, as disclosed in U.S. Pat. Nos. 6,204,139, and 6,473,332, which are incorporated herein by this reference). One of the properties that can be changed is the resistance of the material. The change may be partially or totally reversible using pulses of opposite polarities. This has been defined as the electrical pulse induced non-volatile resistance change effect, abbreviated as the EPIR effect. Based on the EPIR effect, a two terminal non-volatile resistor device, having a structure of electrode/perovskite-active-material-layer/electrode, can be produced, and is called an EPIR device.

What is needed is an EPIR device that requires less pulse voltage to switch the device, that exhibits greater resistance, that is protected from being damaged by a large pulse shock, and that has improved temperature properties and radiation hardness.

SUMMARY OF THE INVENTION

A buffered electric-pulse-induced-resistance change device (buffered-EPIR device) is provided. The buffered-EPIR device comprises a conductive bottom electrode overlying the substrate, a top conductive electrode, a perovskite active layer, and a buffer layer interposed between the perovskite function layer and an electrode, and two or more buffer layers inserted between two sides of perovskite function layer and two electrodes respectively, in the devices. The resistance of the perovskite function layer can be modified by electrical pulses and/or applied DC potentials, and thus such layer is a perovskite switchable function layer. The buffer layer material can be either a non-switchable or switchable material. By adding the buffer layers, the device changes from a device having a structure of electrode/perovskite/electrode, an EPIR device, to a device having a structure of electrode/buffer/perovskite/buffer/electrode, a buffered-EPIR device. The buffered-EPIR device can be fabricated on various substrates such as oxides, semiconductors, and integrated circuit wafer substrates. The benefits of the buffer layers to the device include, but are not limited to, an increased asymmetric configuration and magnifying resistance switching region, reduction of the pulse voltage needed to switch the device, protection of the device from being damaged by a large pulse shock, improvement of the temperature properties and radiation hardness, increased device stability, and improvement of switching to multiple resistance states. The electrical pulse may have square, saw-toothed, triangular, sine, oscillating or other waveforms, and may be of positive or negative polarity. Multiple pulses may be applied to the material to produce incremental changes in properties of the buffered-EPIR device.

The applications of the buffered-EPIR device include non-volatile memory devices, and electrically variable resistors in electronic circuits.

DETAILED DESCRIPTION

Figure 1A:
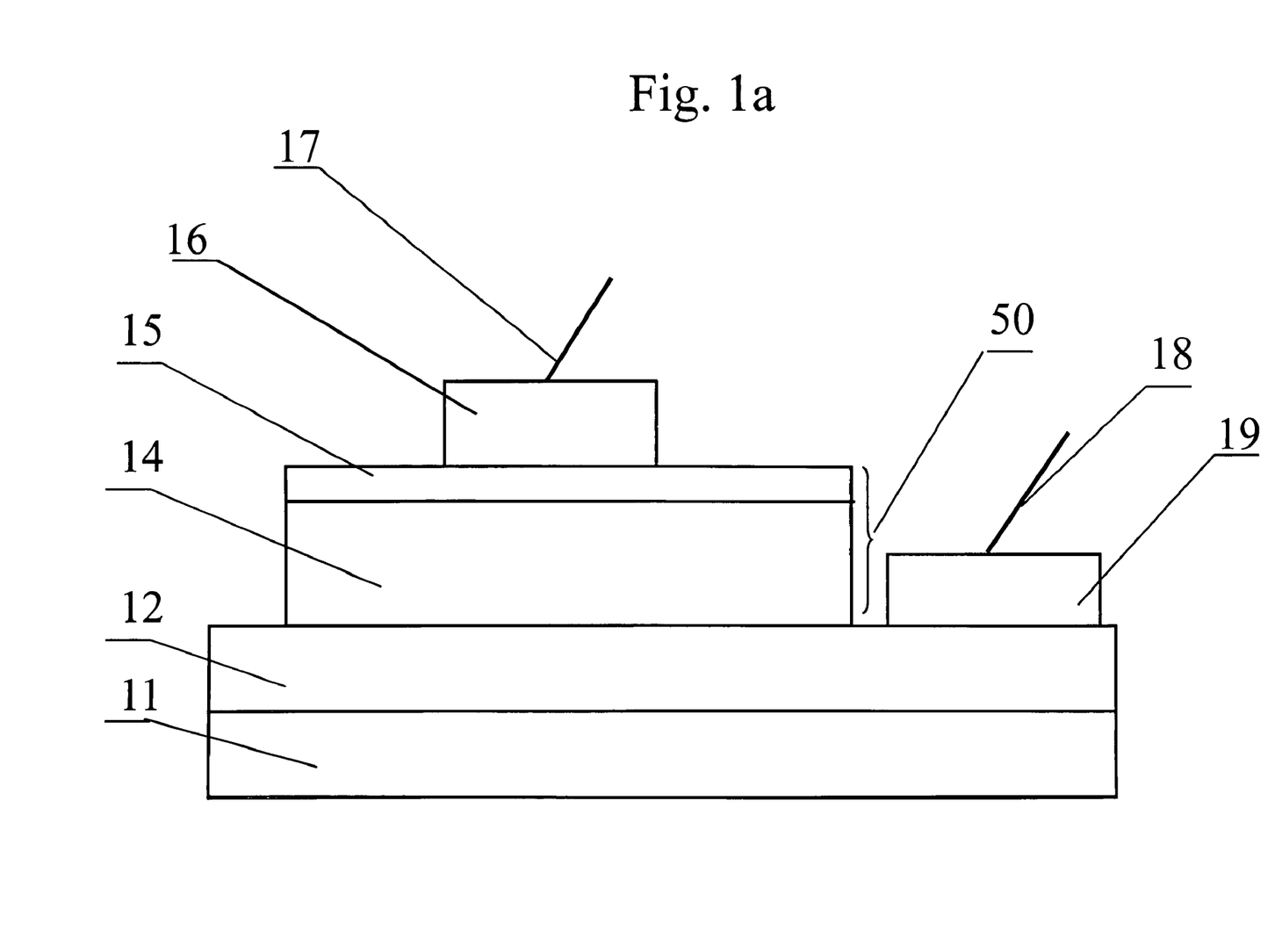
FIG. 1 is a schematic plot of two switchable thin film devices, being two-terminal, buffered-EPIR devices: a) with one buffer layer; b) with two buffer layers.

In summary, buffer layers are added to an EPIR device to create a buffered-EPIR device. Referring to FIG. 1a, a bottom conductive electrode layer 12 is used as the bottom electrode layer on substrate 11. A thin top switchable function film, or layer, 14 partially covers the bottom conductive electrode layer 12. A bottom electrode contact pad 19 is connected to the bottom conductive electrode layer 12. The top switchable function layer 14 is covered with a top buffer layer 15. The top switchable function layer 14 and top buffer layer 15 form a multi-layer structure 50. A top electrode contact pad 16 is fabricated on top of the top buffer layer 15. Electrode contact pads 16 and 19 are connected to wires 17 and 18, respectively. The conductive electrode layer 12 and the top electrode contact pad 16 may be crystalline or polycrystalline conducting oxide or metallic layers.

Figure 1B:
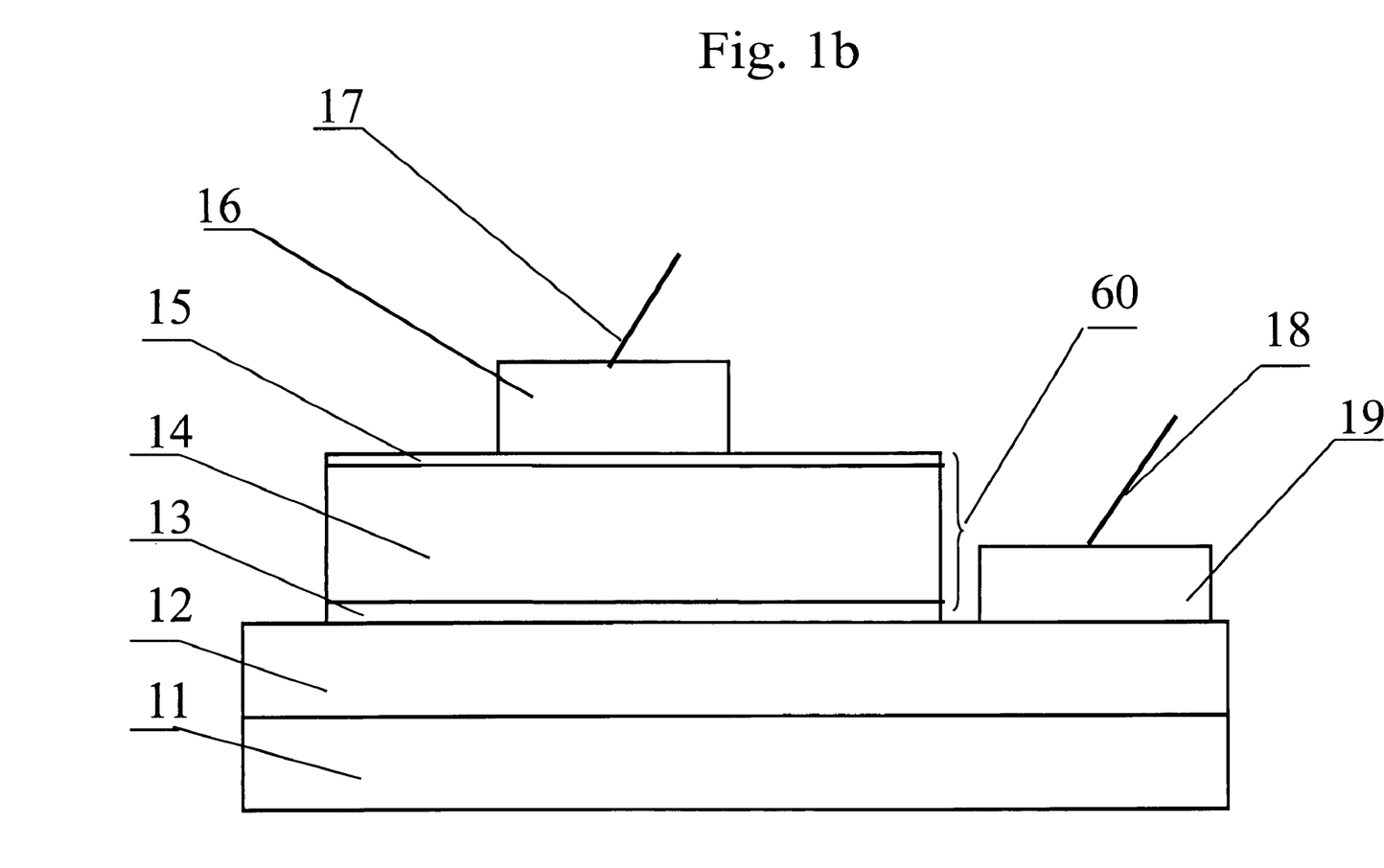

Referring to FIG. 1b, the individual components and their arrangements in the buffered-EPIR device with two buffer layers are the same as in FIG. 1a, except that there is an additional thin bottom buffer layer 13. The thin bottom buffer layer 13, together with the switchable function layer 14 and the top buffer layer 15, form a multi-layer structure 60.

The buffered-EPIR device of FIG. 1a can also be an inverted structure where the buffer layer is deposited on the bottom electrode, and the top electrode contact is made to the switchable function layer. Multiple buffer layers can be substituted for any of the single buffer layers in FIGS. 1a and 1b. Multiple switchable function layers with or without buffer layers in between can be substituted for single layers in FIG. 1a and 1b.

The preferred embodiment of the present invention consists of two conductive film layers as top-electrode and bottom electrode. Material of the conductive layer can be metal, alloy, conductive oxide, or other conductive materials, or their combination, e.g., Pt, $RuO_2$, $SrRuO_3$, $IrO_2$, $YBa_2Cu_3O7-x$ (YBCO), $La_{1-x}Sr_xCoO_3$ (LSCO), SiC, carbon-tube, or their combinations. The bottom conductive electrode layer 12 is deposited on an atomically ordered or polycrystalline substrate 11, e.g., $LaAlO_3$ (LAO), $SrTiO_3$ (STO), MgO, Si, GaAs, TiN, etc., with or without the pre-existence of circuits on the substrate. The bottom electrode contact pad 19 and top electrode contact pad 16 may be made of metal, conductive compounds and their combination, such as Ag, Au, Pt, Al, C, or other metal or alloy or a conducting oxide, and may be deposited by any variety of techniques onto the bottom conductive electrode layer 12 and top buffer layer 15, as well as the top switchable function layer 14, depending on device design.

The switchable function layer 14 is made of a perovskite-related material, such as colossal magneto-resistance (CMR) materials and their parent Mott insulator materials, High transition Temperature Superconducting (HTSC) material families (such as $YBa_2Cu_3O_{7-x}$-based (YBCO) and Bi—Sr—Ca—Cu—O ("BSCCO")), and the $ACu3Ti_4O_{12}$ family of compounds (where A is a trivalent and/or rare earth ion) with thickness in the range from about one nanometer to about several micrometers. For example, CMR materials including the manganese perovskites and the cobalt perovskites described as $ReBMnO_3$ and $ReBCoO_3$, where Re is rare-earth ions, B is alkaline ions, and their doped stoichiometric perovskites (such as $(La,Pr)(CaPb)MnO_3$) and non-stoichiometric perovskites (such as $LnBa(Co,M)_2O_{5+x}$, Ln=Eu or Gd, M=Cu,Fe) can be used as the active switchable layer in the buffered EPIR devices. Examples of HTSC materials are YBCO and the $Bi_2Sr_2Ca_2Cu_3O_x$-based (BSCCO) materials as well as other phases of these materials. The examples of the $ACu_3Ti_4O_{12}$ compound are $CaCu_3Ti_4O_{12}$, $YCu_3Ti_4O_{12}$, and $GdCu_3Ti_3FeO_{12}$.

In the preferred embodiment, buffer layer 13, and/or buffer layer 15, is made of insulating materials consisting of single layer or multi-layer structure. Material for a buffer layer can be oxide or non-oxide with various lattice structures, including crystalline, polycrystalline, and glass. The oxide material for the buffer may be with or without perovskite lattice structure. Non-perovskite oxides, such as $SiO_2$, $CeO_2$, MgO, ZnO, $Y_2O_3$, and their doped oxides, such as yittrium-stabled $ZrO_2$ (YSZ), (Sm,Gd) doped-$CeO_2$, are examples, but others may be suitable. When perovskite oxides are used as buffer layers, they can be switchable or non-switchable insulating materials. These switchable perovskite-related oxide buffer layers can be, but are not limited to, the high dielectric $ACu_3Ti_4O_{12}$ family, CMR materials and their non-doped parent Mott-insulator materials such as $LaMnO_3$, and polar materials such as $Ba_{1-x}Sr_xTiO_3$ (BST), $Pb(Zr,Ti)O_3$ (PZT), La doped-PZT (PLZT), and $Pb_3Ge_5O_{11}$ (PGO). Non-oxide materials such as nitrides can also be used for the buffer layers 13 and 15. The buffer layer thickness is preferably in the range from approximately 1 nm to about 500 nm.

By applying an electrical pulse between the top and bottom electrodes, 16 and 19, through wires 17 and 18, an electric field and current will be created across the multi-layer structure 50 or 60. A sufficiently high electric field strength and/or electric current density can change the charge distribution, and possibly the microstructures, and thus switch their states or modify properties such as the sensitivities to temperature, magnetic field, electric field, and mechanical pressure. Specifically, the reversible resistance switching change in the buffered-EPIR devices can be realized by applying short electric pulses to electrodes 16 and 19.

Because the materials for the top switchable function layer 14, particularly CMR and HTSC materials, have quasi-symmetric structure and electrical properties, the asymmetric interface properties between the bottom electrode 19 and the switchable function layer 14, and between the top electrode 16 and the switchable function layer 14, can be induced or enhanced by adding the buffer layers and the corresponding film deposition processing. The buffer layer may be used on the top side or bottom side or both sides of the switchable function perovskite layer, shown as FIG. 1a-b. In the present invention, the buffered interface is defined as the boundary of conductive electrode(s) and switchable perovskite film, which includes the thin buffer layer and the adjacent surface regions of both the electrode layer and switchable function layer in the buffered-EPIR devices. The thin buffer layers, interposed between the switchable function layer 14 and the electrodes 16 and 19, can be used to modulate the barrier height, the density of electric carriers, carrier mobility, and/or carrier distribution in the interface area. The buffer layers can also be selected to change carrier spin distribution and spin-alignment state in the interface region. The buffer layers can be selected to change the chemical distribution and lattice structure at the interface as well as to modify electrical characteristics of the interface such as filament conduction. The buffer layers can be selected to compensate temperature dependence of device resistance switching performance, and to enhance device radiation hardness. For instance, the additional interface asymmetry induced by the buffer layers can enhance the reversible resistance switching properties of the buffered-EPIR device (resistor) from high-resistance state ($R_H$) to low resistance state ($R_L$) by voltage and current of short electric pulses, and to stabilize the properties of resistive switching and its non-volatility. Further, adding the buffer layers can be used to protect the device from being damaged or degraded by too large of energy shock by applied electric pulses, and to modify the non-volatile hysteresis loops to introduce more resistance states for multi-level memory application of the device.

The buffer layers can be made by various deposition techniques including rf-sputtering, e-beam evaporation, thermal evaporation, metal organic deposition, sol gel deposition, pulse laser deposition, and metal organic chemical vapor deposition, but not limited only to these techniques.

Figure 2:
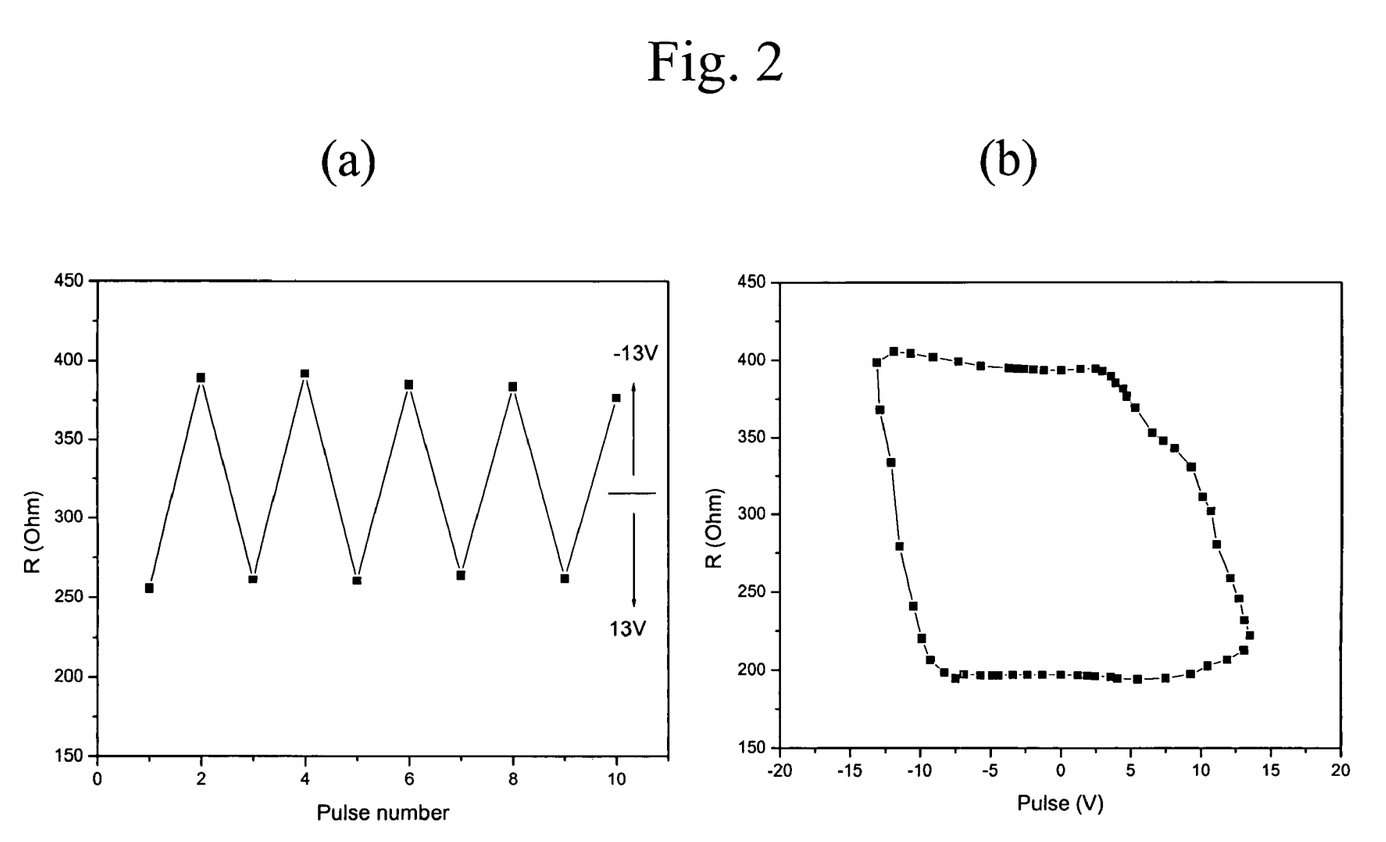
FIGS. 2a and 2b are graphs showing the resistance change measurement of a PCMO ($Pr_{0.7}Ca_{0.3}MnO_3$) device without buffer layer in the test element.

The following are examples to illustrate the need for the buffer layers in buffered-EPIR device of the present invention. FIG. 2 shows the resistance change of a device without a buffer layer (in an EPIR device), using CMR material with composition of $Pr_{0.7}Ca_{0.3}MnO_3$ (PCMO) as the switchable active material. The PCMO film of 600 nm thickness was deposited on top of a YBCO bottom electrode layer of about 500 nm on a $LaAlO_3$ (100) substrate by pulse laser deposition (PLD) method. The switching resistance change after 100 ns single pulses were applied to the device is shown in FIG. 2a. The low resistance value, $R_L$ of ~250Ω, was obtained after a +13V pulse was applied, and the high resistance value, $R_H$ of ~400Ω, was obtained after a −13V pulse was applied. The resistance of the sample is measured with very small sensing current of ~1 μA, which does not switch the resistance of sample. The positive pulse direction is defined as from the top electrode to the bottom electrode. The switch ratio ($R_H$-$R_L$)/$R_L$ in this sample is ~60%. FIG. 2b is R vs. pulse-voltage hysteresis loop for the device measured after each pulse was applied. The resistance change after 5V-pulse is smaller than 10%. Device resistance R reaches the low state after pulses of ≧+12V are applied. It then stays at the low state when lower voltage positive and small voltage negative pulses are applied. R starts to increase after negative voltage pulses with amplitude larger than 10V are applied, and goes to the high state with pulse about −13V. The low state and high state shown in the hysteresis loop measurement are not exactly the same as $R_L$ and $R_H$ obtained in FIG. 2a, because during the hysteresis measurement, multiple-pulses are in effect applied instead of the single switch pulses used in FIG. 2a.

Figure 3:
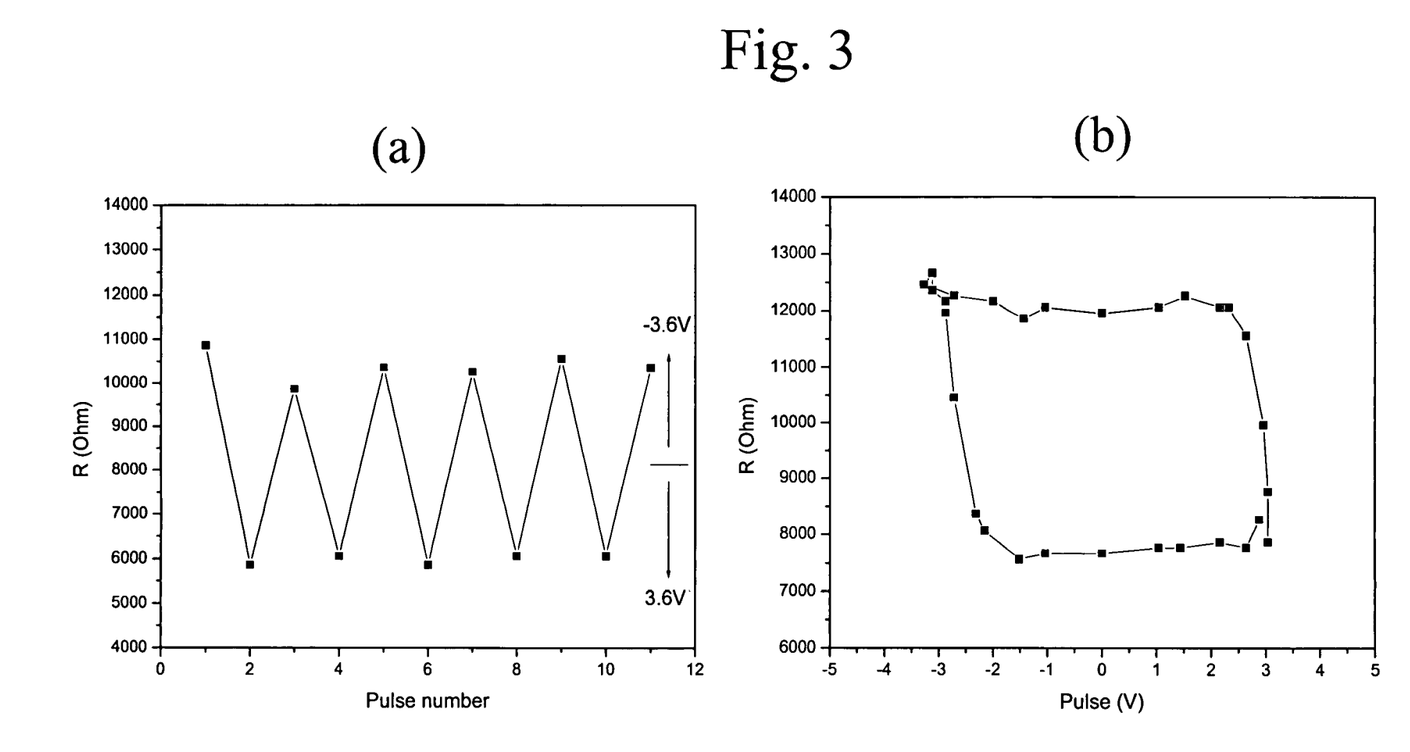
FIGS. 3a and 3b are graphs showing the resistance change measurement of the PCMO device with a YSZ (Yttrium Stabilized Zirconia—$(ZrO_2)_{0.92}(Y_2O_3)_{0.08}$) buffer layer.

FIG. 3 shows the resistance change versus electrical pulse number for the device of the present invention, a buffered-EPIR device, that is, a PCMO device with a YSZ buffer layer between top-electrode and the PCMO layer. The thin YSZ buffer layer was deposited by PLD on the PCMO/YBCO/LAO, which was fabricated under the same growth conditions as the sample used in FIG. 2. FIG. 3a shows the device resistance switching under single pulses. The device resistance increases significantly after adding the insulating YSZ buffer layer. However, the voltage needed for switching the device is reduced to ~3V in comparison with the ±13V for the non buffered EPIR sample in FIG. 2, and the switch ratio of the buffered-EPIR sample is ~70% as shown in FIG. 3a. This shows that lower operation voltage and higher resistance switching ratio are obtained for the buffered-EPIR device as compared to the non-buffered EPIR device. FIG. 3b is the non-volatile resistance hysteresis measurement, which shows the device switches under ±3V pulses. It also shows that a rapid transition to switching into the low or to high R states can be achieved by the buffered-EPIR system due to the nearly rectangular hysteresis loop. Again, the high R and low R states obtained in FIG. 3b are not the same as in FIG. 3a because of the multiple pulses applied in the measurement.

Figure 4:
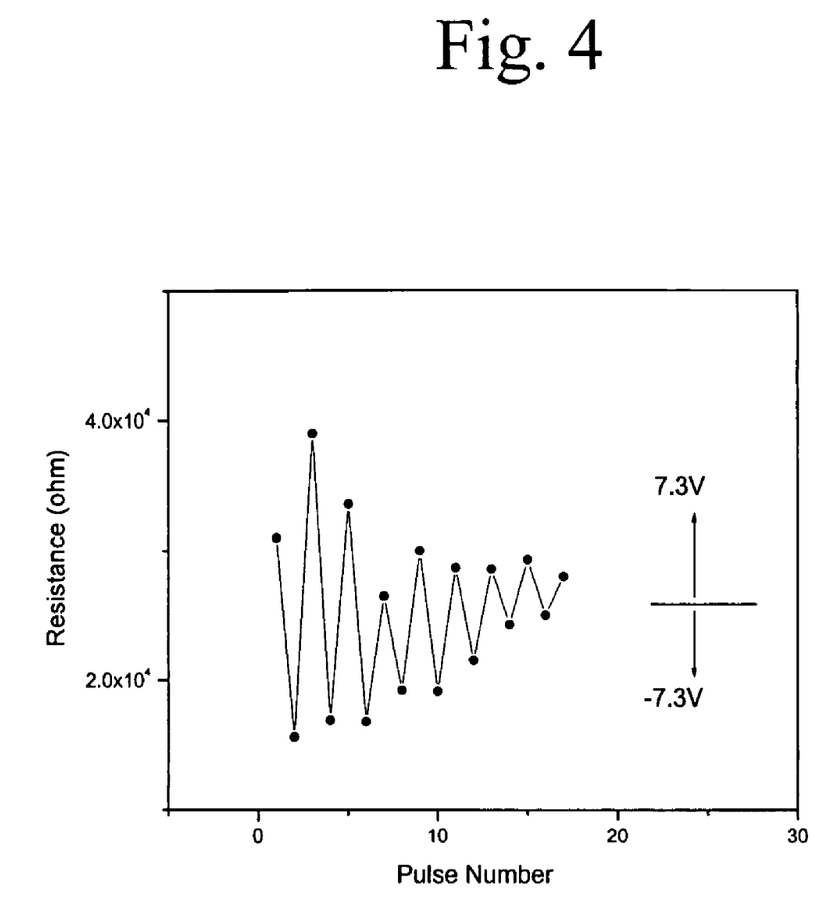
FIG. 4 is a graph showing resistance change measurement of a YSZ layer alone, i.e., without the underlying PCMO perovskite switchable function layer.

Referring now to FIG. 4, the resistance switching properties of a YSZ buffer film without a PCMO active layer in an electrode/YSZ/electrode structure was also studied in order to identify if the resistance switching behavior observed in the buffered-EPIR device was due only to the resistance switching of the YSZ buffer layer. In this test the YSZ film was grown on YBCO/LAO substrate under the same conditions as the sample of FIG. 3 (where the YSZ film was used as a buffer layer and was deposited on PCMO on the YBCO/LAO substrate). The resistance of the YSZ film on YBCO could be switched, but the switch ratio quickly decayed, as shown in FIG. 4. In addition, the YSZ/YBCO sample required a much higher switching pulse voltage of ±7.3V as compared to the ~3V switch voltage needed for the YSZ/PCMO/YBCO sample shown in FIG. 3. This indicates that the PCMO layer is the major active switching layer in the YSZ buffered-EPIR device, and that the buffer layer does improve switching properties of the buffered-EPIR device.

Figure 5:
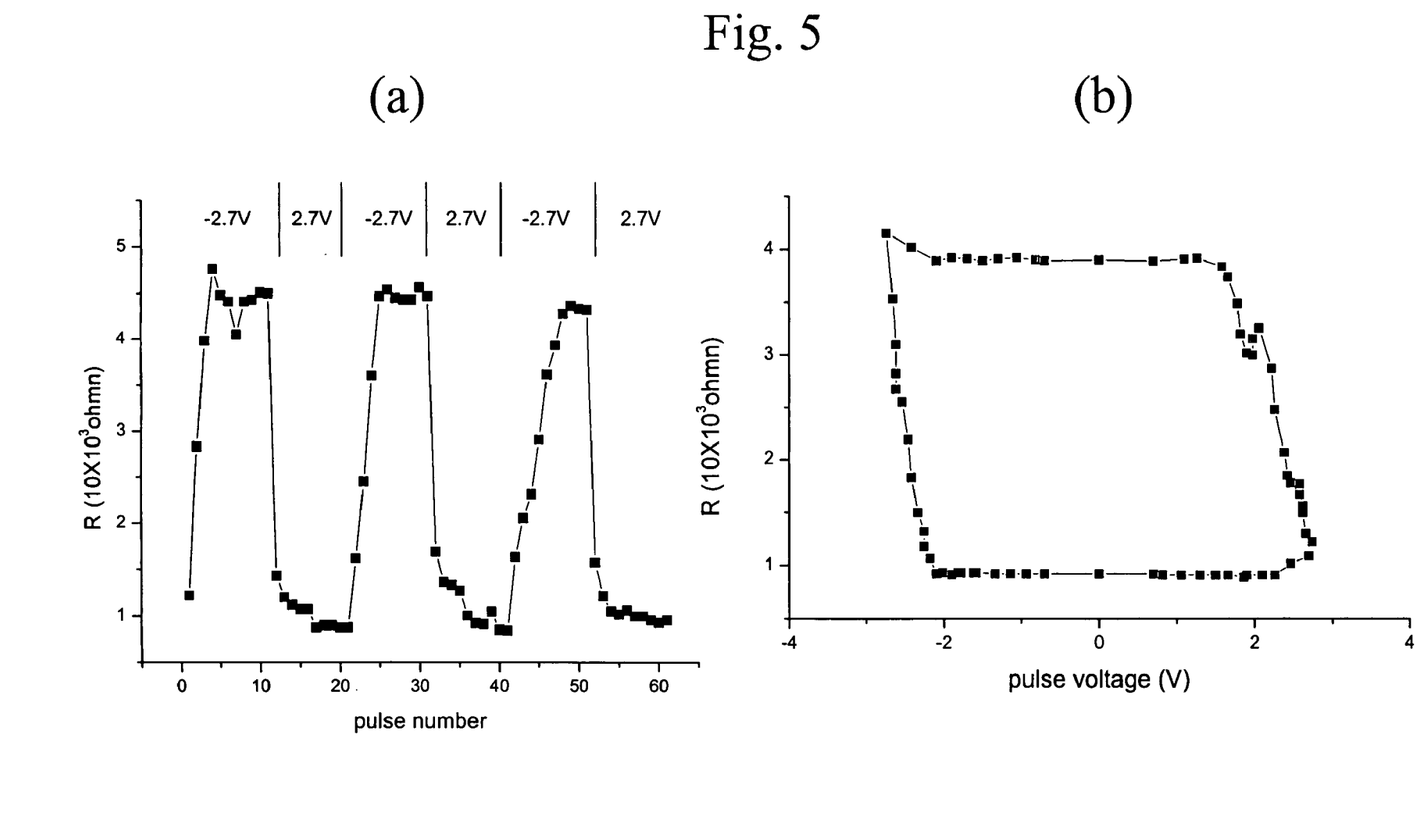
FIGS. 5a and 5b are graphs showing the resistance switch properties induced by electric pulses for a Sm—$CeO_2$/PCMO/YBCO/LAO buffered-EPIR sample.

As another example, non-perovskite insulating $CeO_2$ and Sm-doped $CeO_2$ materials were used as buffer layers. FIG. 5 shows switching in the resistance versus electrical pulse number curve for a PCMO device with a Sm-doped $CeO_2$ buffer layer inserted between an Au top electrode and the PCMO switch layer in the buffered-EPIR device. Multiple pulses were applied under plus and minus pulse polarity, with the device resistance changing by more than a factor of 4 under applied pulse voltage as low as ±2.7V. Such low switching voltage will allow the resistive device to be easily incorporated into semiconductor circuits.

Figure 6:
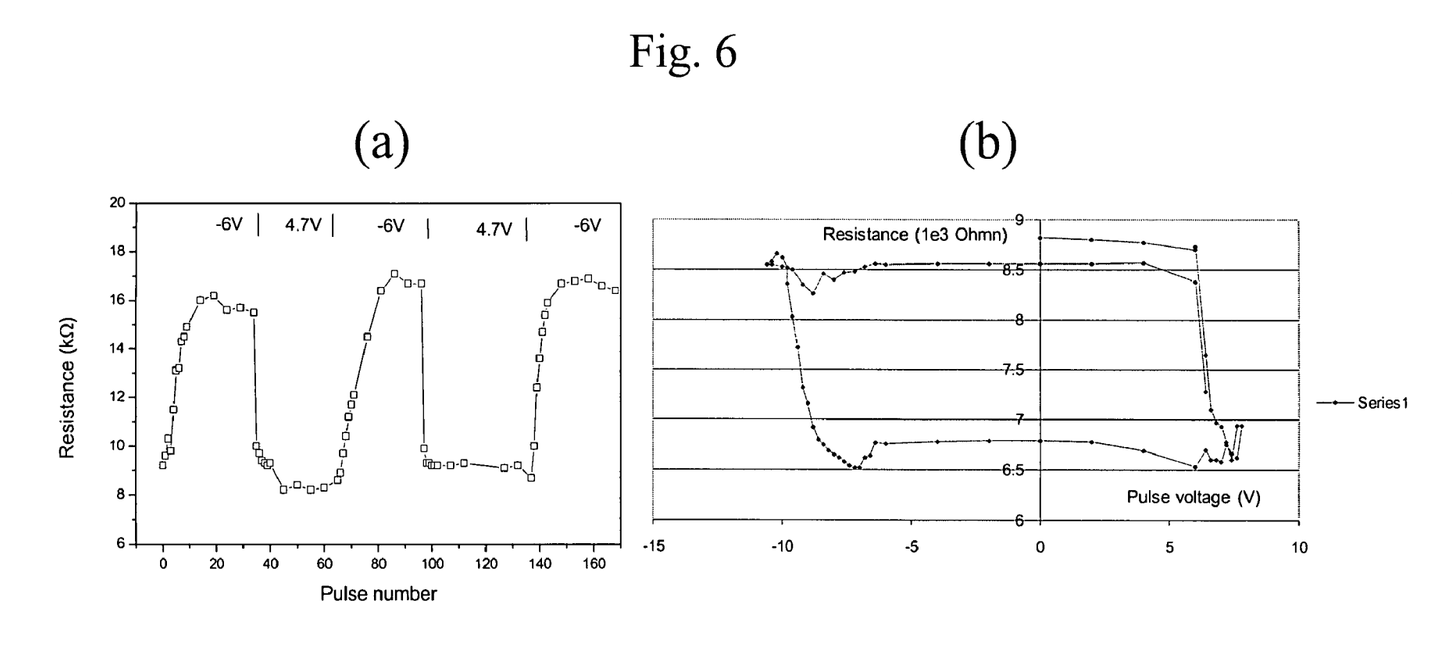
FIGS. 6a and 6b are graphs showing resistance versus electric pulses for a PLZT/PCMO/YBCO/LAO buffered-EPIR memory sample.

As another example, CCTO, PLZT, BST and PGO switchable materials can also be used as the buffer layer in the present invention. The switchable perovskite material can be polar, such as PZT or PLZT, or non-polar material, such as CCTO. A buffered-EPIR device with a buffer PLZT layer inserted between the Ag top electrode and the PCMO layer was switched to the low $R_L$ state (~9 kΩ) by 4.7V pulses, and to the high $R_H$ state (~16 kΩ) by −6V pulses, as shown in FIG. 6, yielding a switch ratio of ~80%. Although PLZT is a ferroelectric material, the buffered-EPIR device of the present invention is different from existing ferroelectric switching devices. In the existing ferroelectric two-terminal devices, the non-volatile switching property is based on the two polarization states, or on dipole moment switching of the ferroelectric layer in the ferroelectric capacitor. This requires the ferroelectric layer to have large resistance (tens of mega ohm or higher) to hold charge separation. The ferroelectric buffer used in the buffered-EPIR device of the present invention is a very thin (few nm) layer with low resistance (hundred Ohms to several kilo Ohms), and thus not supporting ferroelectric state retention.

In the previous examples, the non-volatile resistance switching properties of the buffered-EPIR device were obtained by applying across the device, positive and negative pulses alternatively, that is, bi-polar electric pulses. For some applications, it may be more convenient to switch the device resistance, i.e., increase or decrease resistance by single polarity pulses—only positive pulses or only negative pulses, uni-polar electric pulses with different durations, or with different intensities, or with different applied pulse numbers, or their combination.

Figure 7:
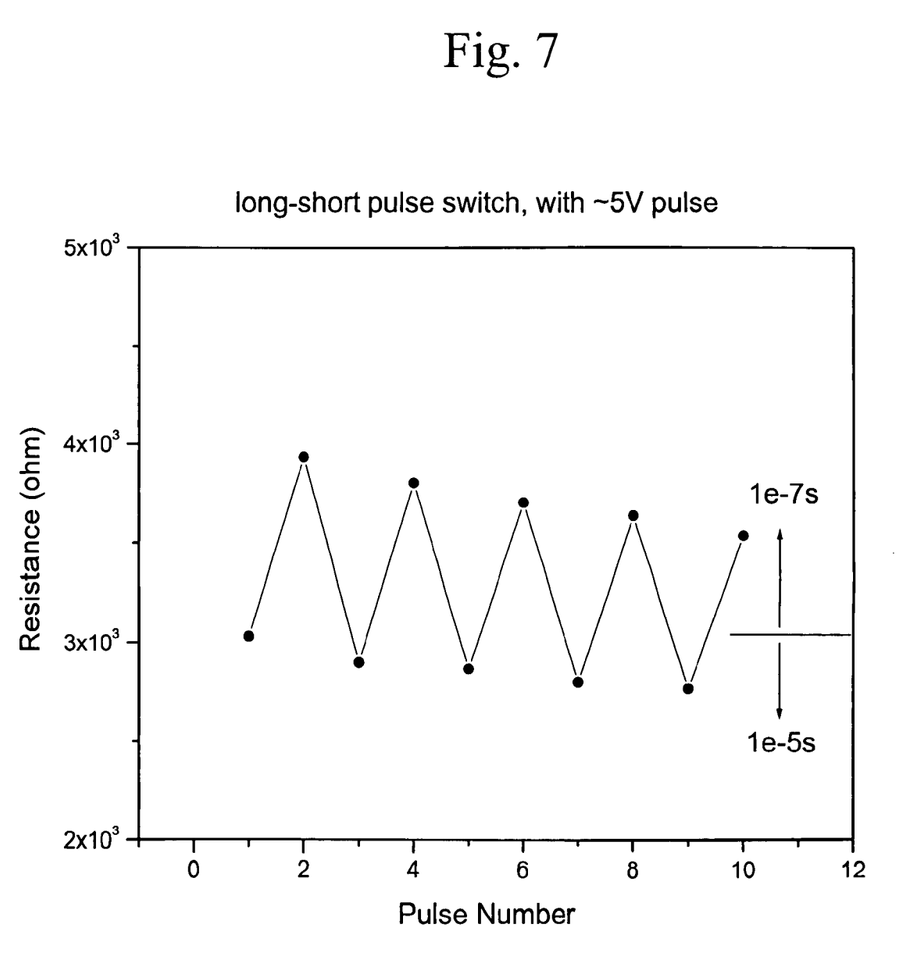
FIG. 7 is a graph showing resistance versus electric pulse number for a YSZ/PCMO/YBCO/LAO memory sample, where the electrical poling pulses have the same polarity (field from top electrode to low electrode). The switching of resistance was caused by pulses with short (100 ns) and long (10 μs) durations.

Referring now to FIG. 7, the non-volatile resistance of a YSZ/PCMO/YBCO/LAO sample was switched by applying uni-polar electric pulses. After initial set up the device was switched to the high resistance state of $R_H$=~3.7 Kohm by application of a +5V, 100 ns positive pulse, and switched to a low resistance state of $R_L$=~2.9 Kohm by application of a +5V, 10 microsecond positive pulse. Similar reversible resistance switching behavior may be achieved not only by both positive pulses, but also by both negative pulses.

The buffer/switchable-layer structure offers great opportunity to modify the layer interface properties, and to modify the character of the hysteresis loop (the definition of the hysteresis has been explained in FIG. 2b and FIG. 3b) of the buffered-EPIR device. These modifications can result in increased flexibility for applications of the reversible nonvolatile resistor. One example is to modify the slope of the transition edge of the hysteresis loop. Sharpening the slope will benefit binary-state applications of the switchable resistor, while flattening the slope of the hysteresis curve will offer more multi-valued resistance states.

Instead of the heterojunction buffer/switchable-function-layer/electrode described in FIG. 1, it is also possible to use in the buffered-EPIR device a switchable perovskite multi-layer materials system with homojunction or gradient configurations, or their combination. The homojunction or gradient materials can be fabricated by controlling doping of the layer materials and/or controlling the film deposition processing. For example, a device can have a top-electrode/YSZ/PCMO structure, and use a graded PCMO film as the bottom electrode, if the lower part of the PCMO layer is doped to be conductive. As another example, a homojunction or gradient PCMO layer can even function as a complete buffer/PCMO/electrode component of a buffered-EPIR device. As a result, the device can be further simplified to be a top-electrode/homojunction or gradient PCMO layer directly on a substrate.

The device can be used to make random access or read only memory devices with high data density and high read/write speed. Another application of this properties-modification method yielding the buffered-EPIR device is for a variable resistor that can be used in electronic circuits. Another application of this method is to modify the characteristics of the device, to increase or decrease their detection sensitivities when they are used as sensors for temperature, magnetic field, electric field, and mechanical pressure. It is not intended that the descriptions above be regarded as limitations upon the present invention.

We claim:

1. A method of using a two terminal multi-layer perovskite thin film resistance device comprising:
   providing a switchable two terminal multi-layer perovskite thin film resistive device comprising:
   a first electrode;
   a second electrode;
   a perovskite material thin film layer between the first and second electrodes;
   a first insulating buffer layer between the perovskite material thin film layer and the first electrode; and
   a second insulating buffer layer between the perovskite material thin film layer and the second electrode; and
   selecting an electrical pulse with a certain polarity and a certain duration; and
   selecting a maximum value and a waveform for the electrical pulse.

2. The method of claim 1, wherein the selected electrical pulses are bipolar.

3. The method of claim 1, wherein the selected electrical pulses are unipolar.

4. The method of claim 1, wherein the selected waveform for the electrical pulse is a square wave.

5. The method of claim 1, wherein the selected waveform for the electrical pulse is a saw-toothed wave.

6. The method of claim 1, wherein the selected waveform for the electrical pulse is a triangular wave.

7. The method of claim 1, wherein the selected waveform for the electrical pulse is a sine wave.

8. The method of claim 1, wherein the selected waveform is an oscillating wave.

* * * * *